United States Patent
Li et al.

(10) Patent No.: US 11,894,468 B2
(45) Date of Patent: Feb. 6, 2024

(54) HIGH VOLTAGE GALLIUM OXIDE ($GA_2O_3$) TRENCH MOS BARRIER SCHOTTKY AND METHODS OF FABRICATING SAME

(71) Applicant: Cornell University, Ithaca, NY (US)

(72) Inventors: Wenshen Li, Ithaca, NY (US); Zongyang Hu, Ithaca, NY (US); Kazuki Nomoto, Ithaca, NY (US); Debdeep Jena, Ithaca, NY (US); Huili Grace Xing, Ithaca, NY (US)

(73) Assignee: Cornell University, Ithaca, NY (US)

( * ) Notice: Subject to any disclaimer, the term of this patent is extended or adjusted under 35 U.S.C. 154(b) by 45 days.

(21) Appl. No.: 17/291,689

(22) PCT Filed: Oct. 30, 2019

(86) PCT No.: PCT/US2019/058864
§ 371 (c)(1),
(2) Date: May 6, 2021

(87) PCT Pub. No.: WO2020/096838
PCT Pub. Date: May 14, 2020

(65) Prior Publication Data
US 2021/0384362 A1 Dec. 9, 2021

Related U.S. Application Data

(60) Provisional application No. 62/756,250, filed on Nov. 6, 2018.

(51) Int. Cl.
*H01L 29/872* (2006.01)
*H01L 29/24* (2006.01)
(Continued)

(52) U.S. Cl.
CPC .......... *H01L 29/8725* (2013.01); *H01L 29/24* (2013.01); *H01L 29/36* (2013.01); *H01L 29/407* (2013.01); *H01L 29/66969* (2013.01)

(58) Field of Classification Search
CPC ....... H01L 29/872; H01L 29/24; H01L 29/47; H01L 29/8725
See application file for complete search history.

(56) References Cited

U.S. PATENT DOCUMENTS

2001/0010385 A1* 8/2001 Hijzen ................. H01L 29/407
257/481
2016/0042949 A1* 2/2016 Sasaki ................ H01L 27/0605
257/617
(Continued)

FOREIGN PATENT DOCUMENTS

WO WO2019191465 A1 10/2019

OTHER PUBLICATIONS

Sasaki, K., et al. "Depletion-mode vertical Ga2O3 trench MOSFETs fabricated using Ga2O3 homoepitaxial films grown by halide vapor phase epitaxy." Appl Phys Express 10.12 (2017): 124201.
(Continued)

*Primary Examiner* — Samuel A Gebremariam
*Assistant Examiner* — Jonas T Beardsley
(74) *Attorney, Agent, or Firm* — Culhane Meadows PLLC; Orlando Lopez

(57) ABSTRACT

Described herein are the design and fabrication of Group III trioxides, such as $\beta$-$Ga_2O_3$, trench-MOS barrier Schottky (TMBS) structures with high voltage (>1 kV), low leakage capabilities, while addressing on the necessary methods to meet the requirements unique to Group III trioxides, such as $\beta$-$Ga_2O_3$.

22 Claims, 6 Drawing Sheets

(51) Int. Cl.
*H01L 29/36* (2006.01)
*H01L 29/40* (2006.01)
*H01L 29/66* (2006.01)

(56) References Cited

U.S. PATENT DOCUMENTS

| | | | |
|---|---|---|---|
| 2017/0148927 A1* | 5/2017 | Yu | H01L 29/0661 |
| 2017/0200833 A1* | 7/2017 | Conway | H01L 29/8083 |
| 2018/0269335 A1* | 9/2018 | Hasegawa | H01L 29/47 |
| 2019/0148563 A1* | 5/2019 | Sasaki | H01L 29/24 |
| | | | 257/43 |
| 2019/0229208 A1* | 7/2019 | Matioli | H01L 29/0657 |
| 2021/0074826 A1* | 3/2021 | Watahiki | H01L 29/66212 |
| 2021/0151611 A1* | 5/2021 | Sasaki | H01L 29/47 |
| 2021/0305369 A1* | 9/2021 | Nakano | H01L 29/7813 |

OTHER PUBLICATIONS

Zhang, L. "Beta Gallium Oxide Materials Processing and Device Applications." A Thesis Presented to the Faculty of the Graduate School of Cornell University, Aug. 2017 [online].
10845-318 PCT ISR and WO, Jan. 21, 2020.

* cited by examiner

HIGH VOLTAGE GALLIUM OXIDE (GA₂O₃) TRENCH MOS BARRIER SCHOTTKY AND METHODS OF FABRICATING SAME

CROSS-REFERENCE TO RELATED APPLICATIONS

This application is a U.S. national stage application under 35 U.S.C. 371 of co-pending International Application No. PCT/US2019/058864 filed on Oct. 30, 2019 and entitled HIGH VOLTAGE GROUP III TRIOXIDE TRENCH MOS BARRIER SCHOTTKY AND METHODS OF FABRICATING SAME, which in turn claims priority to U.S. Provisional Patent Application No. 62/756250, filed Nov. 6, 2018, both of which are incorporated herein by reference in their entirety and for all purposes.

STATEMENT OF FEDERALLY SPONSORED RESEARCH OR DEVELOPMENT

This disclosure was made in part with United States Government support under Grant Nos. DMREF 1534303 awarded by the National Science Foundation, and FA9550-17-0048 awarded by the Air Force Office of Scientific Research. The United States government has certain rights in the invention.

BACKGROUND

Power semiconductor rectifiers or diodes are ubiquitous in power electronics circuits and systems. Ideally, the power diodes should have a high voltage blocking capability with minimal leakage current, a negligible forward voltage drop and no storage charge for minimal switching loss. For low storage charge, it is preferable to use Schottky barrier diodes. In the case of silicon, which is still the most widely-used material in the power semiconductor industry, the Schottky barrier diodes covers the blocking voltage up to 100-200 V. For higher blocking voltage, the drift layer of the Si Schottky barrier diodes needs to be thicker and the doping concentration needs to be lowered in order to maintain a surface field lower than the critical breakdown field. This will negatively affect the on-resistance. Thus, for higher voltage rating, p-i-n diodes are preferred in silicon.

It is well-known that the specific on-resistance ($R_{on}$) and breakdown voltage (BV) of the drift region in a power device have a trade-off relationship. Specifically, $BV^2/R_{on}$, also referred to as Baliga's figure of metit (BFOM), is proportional to the electron mobility and the cube of the critical electrical field for a given semiconductor material. Since the critical electric field increases monotonously with the bandgap of a semiconductor, wide bandgap materials are more likely to have a higher Baliga's figure of merit, thus lower on-resistance for the same breakdown voltage. As a result, Schottky barrier diodes using wide bandgap material can be made with higher voltage ratings, without resorting to bi-polar conduction mode as in the p-i-n diodes. In other words, power rectifiers with high voltage rating and simultaneously fast switching speed become possible with wide band-gap materials.

Among various wide bandgap materials, β-Ga₂O₃ has a high critical breakdown field of up to ~8 MV/cm, as well as a decent electron mobility of ~200 cm²/V·s, which translates to a unipolar FOM higher than that of 4H—SiC and GaN. In addition, single crystal bulk substrate is available in β-Ga₂O₃ through melt-grown method. These unique advantages make β-Ga₂O₃ very attractive for power electronic devices, including Schottky barrier diodes and the like.

One of the main challenges in Schottky barrier diode is the control of the leakage current through the Schottky barrier at high surface field. To reduce the electric field near the Schottky contact, reduce surface field (RESURF) techniques can be utilized. Among the RESURF techniques, a trench-MOS barrier Schottky (TMBS) structure is an effective way to reduce the surface electric field, while not requiring p-type regions. Since effective p-type doping is yet to be demonstrated in β-Ga₂O₃, TMBS is an attractive topology in β-Ga₂O₃. There are existing patents on the design and fabrication of TMBS in silicon, but they are not suitable for direct implementation in Group III trioxides, such as β-Ga₂O₃, due to the uniqueness of the material properties of Group III trioxides, such as β-Ga₂O₃. There are existing publications from another research group on the attempt of realizing β-Ga₂O₃ TMBS structures, but the RESURF effect was not effectively implemented thus only low voltage (<300 V) was demonstrated.

There are existing products that address the same problems, i.e. high voltage (>600 V) rectification with low conduction and switching loss, such as: SiC Schottky diodes (https://www.wolfspeed.com/power/products/sic-schottky-diodes), CoolSiC Schottky diodes (https://www.infineon.com/cms/en/product/power/wide-band-gap-semiconductors-sic-gan/silicon-carbide-sic/coolsic-schottky-diode/), and SiC Schottky diodes (https://www.rohm.com/products/sic-power-devices/sic-schottky-barrier-diodes). These Schottky diodes are based on SiC, another wide bandgap semiconductor. But there are materials, such as Group III trioxides, that can lead to devices with larger projected critical breakdown electric field.

There is a need for trench-MOS barrier Schottky (TMBS) structures with high voltage (>1 kV), low leakage capabilities.

SUMMARY

This disclosure relates to methods of fabricating high breakdown voltage vertical trench MOS barrier Schottky (TMBS) rectifiers using Group III trioxides, such as β-Ga₂O₃, bulk substrate and epitaxy. The diodes are capable of low on-resistance, high blocking voltages (>1 kV), and simultanously low reverse leakage current density (<1 mA/cm²).

In comparison with SiC, Group III trioxides, such as β-Ga₂O₃, has a larger bandgap of >4.5 eV, thus a much larger projected critical breakdown electric field (~8 MV/cm) and higher figure-of-merit. Using Group III trioxides, such as β-Ga₂O₃, for the making of Schottky diodes, together with the trench-MOS barrier Schottky technology applicable to Group III trioxides, such as β-Ga₂O₃, lower on-resistance can be realized with the same voltage rating, or higher voltage rating can be achieved with the same on-resistance.

In one or more embodiments, the Group III trioxide semiconductor device of these teachings includes a first electrically conductive contact layer, an n-type group III trioxide single crystal material layer disposed electrically operatively in contact with the first electrically conductive contact layer, the n-type group III trioxide single crystal material layer having a first distal surface disposed away from the first electrically conductive contact layer, at least two upstanding channels, each upstanding channel having a distal top surface and sidewalls extending between the distal top surface and the first distal surface of the n-type group III trioxide single crystal material layer, each upstanding channel being separated from another upstanding channel by a trench, a doping concentration of the n-type group III trioxide single crystal material layer being one of a varying doping concentration, the varying doping concentration having a largest value and a smallest value according to a predetermined configuration, and a predetermined doping concentration. The Group III trioxide semiconductor device of these teachings also includes a dielectric layer deposited over the first distal surface, over sidewalls of each upstanding channel, and over a bottom surface of each trench of the n-type group III trioxide single crystal material layer, a second electrically conductive layer deposited over the dielectric layer on the sidewalls of each upstanding channel, a third electrically conductive layer deposited over the dielectric layer on the bottom surface of each trench, and over a portion of the dielectric layer on the first distal surface; the third electrically conductive layer, which is disposed over the portion of the dielectric layer on the first distal surface, being disposed a predetermined distance away from a vertical edge surface of the group III trioxide semiconductor device; the third electrically conductive layer being in electrical contact with the second electrically conductive layer, and, a fourth electrically conductive layer deposited over the distal top surface of each upstanding channel; the fourth electrically conductive layer being in electrical contact with the second electrically conductive layer.

In one or more embodiments, the method for fabricating a group III trioxide Schottky diode of these teachings includes depositing an n-type group III trioxide single crystal material layer, a doping concentration of the n-type group III trioxide single crystal material layer being one of a varying doping concentration, the varying doping concentration having a largest value and a smallest value according to a predetermined configuration, and a predetermined doping concentration, depositing a Schottky conductive contact layer on the n-type group III trioxide single crystal material layer, etching to form at least two upstanding channels on the n-type group III trioxide single crystal material layer with the Schottky conductive contact layer, each upstanding channel having sidewalls extending between the Schottky conductive contact layer and a first distal surface of the n-type group III trioxide single crystal material layer, each upstanding channel being separated from another upstanding channel by a trench, depositing a dielectric layer over the first distal surface, over the at least two upstanding channels, over sidewalls of each upstanding channel, and over a bottom surface of each trench, etching the dielectric layer to expose the Schottky conductive contact layer on a top distal surface of each upstanding channel, depositing a second conductive layer over the dielectric layer on the sidewalls of each upstanding channel, depositing a third conductive layer over the dielectric layer on the bottom surface of each trench, and over a portion of the dielectric layer on the first distal surface, the third conductive layer, which is disposed over the portion of the dielectric layer on the first distal surface, being disposed a predetermined distance away from a vertical edge surface of the group III trioxide Schottky diode, and depositing a conductive ohmic contact layer.

In some embodiments, a conductive substrate is used, the n-type group III trioxide single crystal material layer is deposited on the conductive substrate, and the conductive ohmic contact layer is deposited on the opposite surface of the conductive substrate.

In other embodiments, the n-type group III trioxide single crystal material layer is deposited on a substrate, and, after forming the channels, depositing the dielectric layer, exposing the Schottky conductive contact layer, and depositing the other conductive layers, the substrate is removed and the conductive ohmic contact layer is deposited on a surface of the n-type group III trioxide single crystal material layer that is opposite the first distal surface and the Schottky conductive contact layer.

In yet other embodiments, the n-type group III trioxide single crystal material layer is deposited on a an n-doped group III trioxide single crystal second layer, and the conductive ohmic contact layer is deposited on a surface of the n-doped group III trioxide single crystal second layer opposite to the surface on which the n-type group III trioxide single crystal material layer was deposited.

A number of other embodiments are also disclosed.

These and other features and advantages will be apparent from a reading of the following detailed description and a review of the associated drawings. It is to be understood that both the foregoing general description and the following detailed description are explanatory only and are not restrictive of aspects as claimed.

BRIEF DESCRIPTION OF THE FIGURES

The disclosure will be more fully understood by reference to the detailed description, in conjunction with the following figures, wherein.

DETAILED DESCRIPTION

Figure 1A:
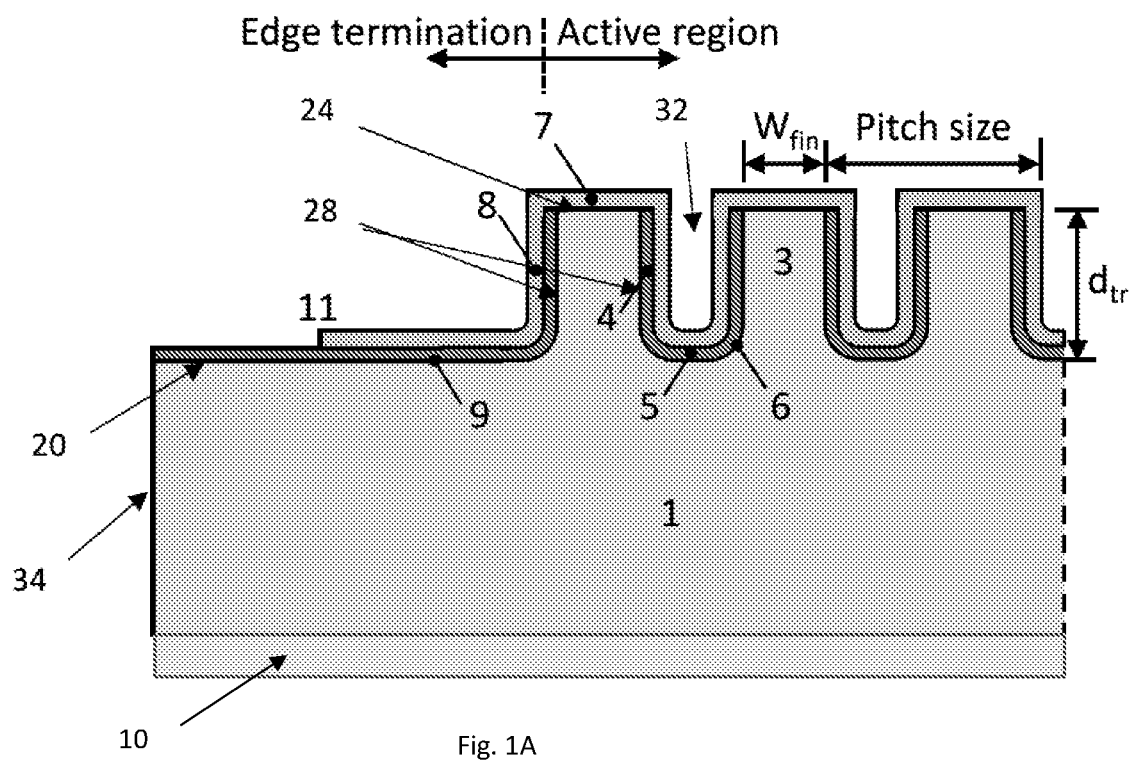
FIGS. 1A-1C show Schematic cross-sections of a high-voltage Group III trioxides, such as $\beta$-$Ga_2O_3$, trench-MOS barrier Schottky rectifier of these teachings.

In the description that follows, like components have been given the same reference numerals, regardless of whether they are shown in different examples. To illustrate example(s) in a clear and concise manner, the drawings may not necessarily be to scale and certain features may be shown in somewhat schematic form. Features that are described and/or illustrated with respect to one example may be used in the same way or in a similar way in one or more other examples and/or in combination with or instead of the features of the other examples.

As used in the specification and claims, for the purposes of describing and defining the disclosure, the terms about and substantially are used to represent the inherent degree of uncertainty that may be attributed to any quantitative comparison, value, measurement, or other representation. The terms about and substantially are also used herein to represent the degree by which a quantitative representation may vary from a stated reference without resulting in a change in the basic function of the subject matter at issue. Comprise, include, and/or plural forms of each are open ended and include the listed parts and can include additional parts that are not listed. And/or is open-ended and includes one or more of the listed parts and combinations of the listed parts.

For clear understanding of these teachings, the following definitions are provided.

"Group III," as used here in, refers to a group of elements in the periodic table including what are now called Group 13 elements: boron (B), aluminium (Al), gallium (Ga), indium (In), thallium (Tl).

"Work function or electronic work function," as used here in, refers to is the minimum thermodynamic work (i.e., energy) needed to remove an electron from a solid to a point in the vacuum immediately outside the solid surface. The lowest work function metal is cesium with her work function of 2.14 electron volts and the highest work function metal is platinum with a work function of approximately 6.35 electron volts.

"Upstanding channels," where each upstanding channel is separated from another upstanding channel by a trench, refers to the configuration that is also referred to in the literature as "fins" or trenches, as in M. Mehrotra, and B. J. Baliga, in *IEDM Tech. Dig.* (1993), p. 675 (referring to "Trench MOS Barrier Schottky" configuration), or in Wenshen Li et al., 1230 V β-Ga$_2$O$_3$ trench Schottky barrier diodes with an ultra-low leakage current of <1 μp.A/cm$^2$, Appl. Phys. Lett. 113, 202101 (2018), which uses trench and fin interchangeably.

Described herein are the design and fabrication of Group III trioxides, such as β-Ga$_2$O$_3$, TMBS with high voltage (>1 kV), low leakage capabilities, while addressing on the necessary methods to meet the requirements unique to Group III trioxides, such as β-Ga$_2$O$_3$.

Figure 1C:
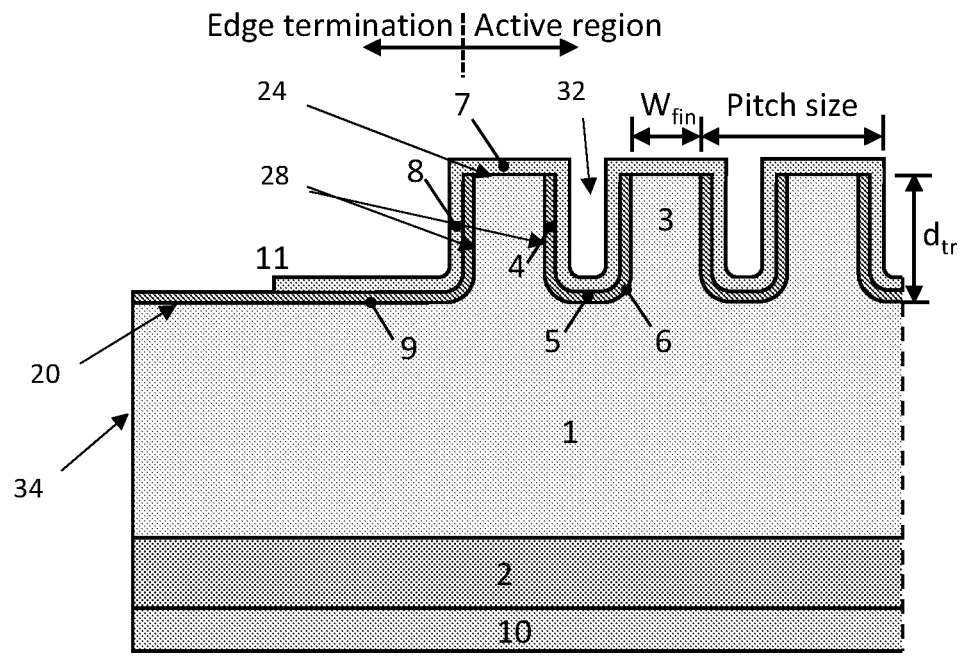
Figure 1B:
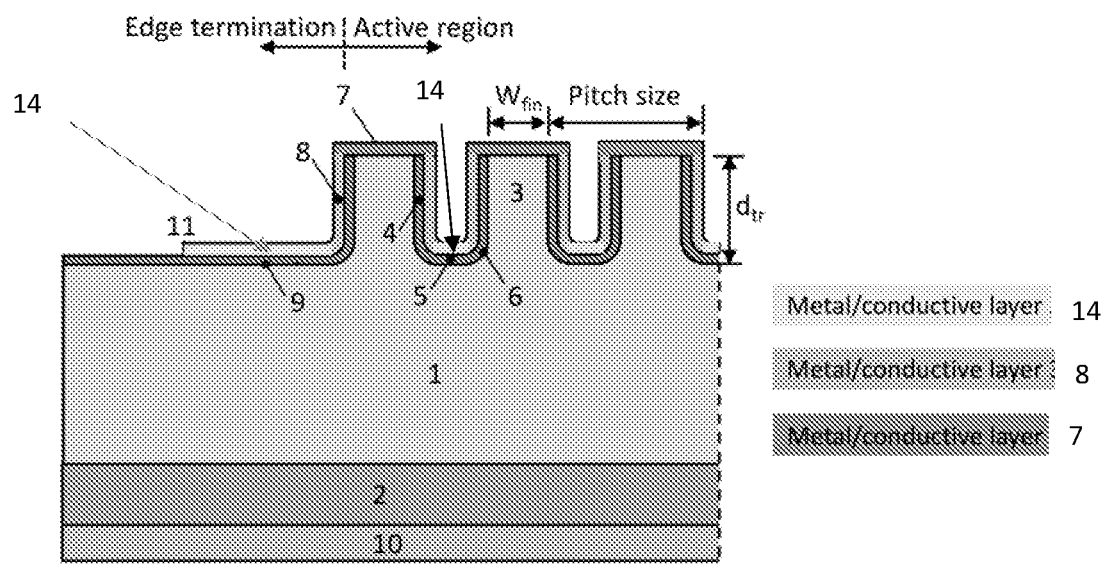

Components of the Group III trioxide (such as, β-Ga$_2$O$_3$) trench-MOS barrier Schottky device of these teachings are labeled in FIGS. 1A-1C for the embodiment shown there in. In FIG. 1A, the Group III trioxide the device has a first electrically conductive contact layer 10, an n-type group III trioxide single crystal material layer 1 disposed electrically operatively in contact with the first electrically conductive contact layer 10. The n-type group III trioxide single crystal material layer has a first distal surface 20 disposed away from the first electrically conductive contact layer 10, at least two upstanding (fin) channels 3, each upstanding channel 3 having a distal top surface 24 and sidewalls 28 extending between the distal top surface 24 and the first distal surface 20 of the n-type group III trioxide single crystal material layer 1. Each upstanding channel 3 is separated from another upstanding channel 3 by a trench 32, The doping concentration of the n-type group III trioxide single crystal material layer can be one of a varying doping concentration and a predetermined doping concentration. The varying doping concentration has a largest value and a smallest value according to a predetermined configuration. The configuration of the varying doping concentration is selected according to the desired design. In one embodiment, the varying doping concentration can have a lowest doping concentration below the channels and above a region with the largest concentration and have an intermediate doping concentration in the channels. A number of other designs are within the scope of these teachings. A dielectric layer 4 is deposited over the first distal surface 20 over the sidewalls 28 of each upstanding channel 3, and 5 of over a bottom surface of each trench 32. A second conductive layer 8 is deposited over the dielectric layer 4 on the sidewalls 28 of each upstanding channel 3. A second electrically conductive layer 8 is deposited over the dielectric layer 4 on the sidewalls 28 of each upstanding channel 3. A third electrically conductive layer 14 is deposited over the dielectric layer 5 on the bottom surface of each trench 32 and a portion of the dielectric layer on the first distal surface 20.The third electrically conductive layer 14 that is deposited over the portion of the dielectric layer on the first distal surface 20 is a predetermined distance away from a vertical edge surface 34 of the device. Electrically conductive layer 14 is in in electrical contact with the second electrically conductive layer 8. A fourth electrically conductive layer 7 is deposited over the distal top surface 24 of each upstanding channel 3. The fourth electrically conductive layer 7 is in electrical contact with the second electrically conductive layer 8.

In another embodiment, a conductive substrate is disposed between the first electrically conductive contact layer 10 and the n-type group III trioxide single crystal material 1. The possible conductive substrates include, but are not limited to, single-crystal SiC substrate, poly-crystalline SiC substrate, GaN substrate, poly-crystalline, copper substrate, Si substrate, etc.

In some embodiments in which the doping concentration of the n-type group III trioxide single crystal material layer 1 is a a varying doping concentration, a largest doping concentration is greater than $1\times10^{18}$ cm$^{-3}$ and a smallest concentration is not less than $1\times10^{15}$ cm$^{-3}$.

In yet another embodiment, the group III trioxide semiconductor device also includes an n-doped group III trioxide single crystal second layer 2 disposed between the first electrically conductive contact layer 10 and the n-type group III trioxide single crystal material layer 1. In one instance, the doping concentration of the n-doped group III trioxide single crystal second layer is greater than $1\times10^{15}$ cm$^{-3}$.

The components of the above described embodiments of the group III trioxide device of these teachings are described here in below making reference to the reference number:

1. An epitaxial layer of Group III trioxide (such as, β-Ga$_2$O$_3$) with a low net doping concentration on n-type single-crystal bulk Group III trioxide (such as, β-Ga$_2$O$_3$ (001)) substrates;

2. Single-crystal bulk the Group III trioxide (such as, β-Ga$_2$O$_3$) substrate with a high n-type doping concentration;

3. Fin-shaped (upstanding) conduction channels; the upstanding channels;

4. High dielectric constant, high breakdown field dielectric layer on the sidewall of the fin-shaped channel;

5. High dielectric constant, high breakdown field dielectric layer covering the trench;

6. Smoothly curved trench bottom corner;

7. Schottky metal contact on top of fin channels as well as on the trench bottom;

8. Metal/conductive material contact on the sidewall of the fin channels on top of the dielectric layer; the metal/conductive material should preferably have a low work-function; the lower work function contact metal (in the conductive material) on the sidewall will lead to less depletion of the fin channel due to the smaller work function difference between the metal and Group III trioxide (such as, β-Ga$_2$O$_3$), which is preferable for lower on-resistance;

9. Device edge termination is made on the flat surface (also referred to as the first distal surface) flush with the trench bottom; this allows for a much reduced field crowding at the trench bottom corner closest to the device edge/periphery;

10. Ohmic metal/conductive material contact on the backside of the wafer;

11. Metal/conductive material overhang at the edge of the device on top of the dielectric layer, forming a field plate for edge termination;

14. Metal/conductive material on the bottom of the trenches and on a portion of the first distal surface 20.

In one instance, the second electrically conductive layer includes, in proximity to the sidewall, a metal with a low electronic work function (for example, an electronic work function of less than 5 eV). In one embodiment, the metal with a low electronic work function is one of Ti, Cr, Al, Mo or W or compounds thereof.

In another instance, the second electrically conductive layer includes, in proximity to the sidewall, a metal with a electronic work function less than 6 eV or compounds thereof.

Typical parameter ranges for the Group III trioxide trench-MOS barrier Schottky device of these teachings are provided below.

1. Thickness of the n-type epitaxial layer (1) is between 2-50 µm, doping concentration of the n-type epitaxial layer (1) is between $1 \times 10^{15} - 5 \times 10^{17}$ cm$^{-3}$.
2. Trench depth/Fin channel height ($d_{tr}$ in FIG. 1) is between 0.5~4 µm
3. Fin channel width ($W_{fin}$ in FIG. 1) is between 0.2~4 µm.
4. Trench width is between 0.2~4 µm.
5. Pitch size (trench width+fin channel width, shown in FIG. 1) is between 0.4~8 µm.
6. The Schottky contact metal/conductive material layer (7) is between 5-5000 nm. Possible materials for the Schottky contact metal/conductive material layer are Ni, Pt, Cu, Pd, Au, Mo, Ag, Al, Cr, Ti, W, Fe, etc., or combinations of those metals.
7. Metal hard mask used for etching the upstanding channels (3) needs to be thick enough.
8. The (Al$_2$O$_3$) dielectric thickness (4) is between 10-400 nm. Possible materials include Al2O3, HfO2, HfSiO4, ZrO2, crystalline Al2O3, AlN, Si3N4, ZrSiO4, BaO, SiO2, La2O3, BaTiO3.
9. The Sidewall metal stack (8) should be Ti or Cr of a thickness between 5-3000 nm (first layer, proximate to the sidewall)/Pt of a thickness between 5-3000 nm for the second layer (optional). First layer should preferably use Ti, Cr, Al, Mo, or W. Second layer is optional, with an arbitrary choices of metal.
10. The Backside ohmic contact metal/conductive material stack could be Ti of a thickness between 5-5000 nm (first layer)/Au of a thickness between 5-10000 nm for the second layer. First layer should preferably use Ti, Cr, or Al. Second layer could use arbitrary choices of metal.

Figure 2:
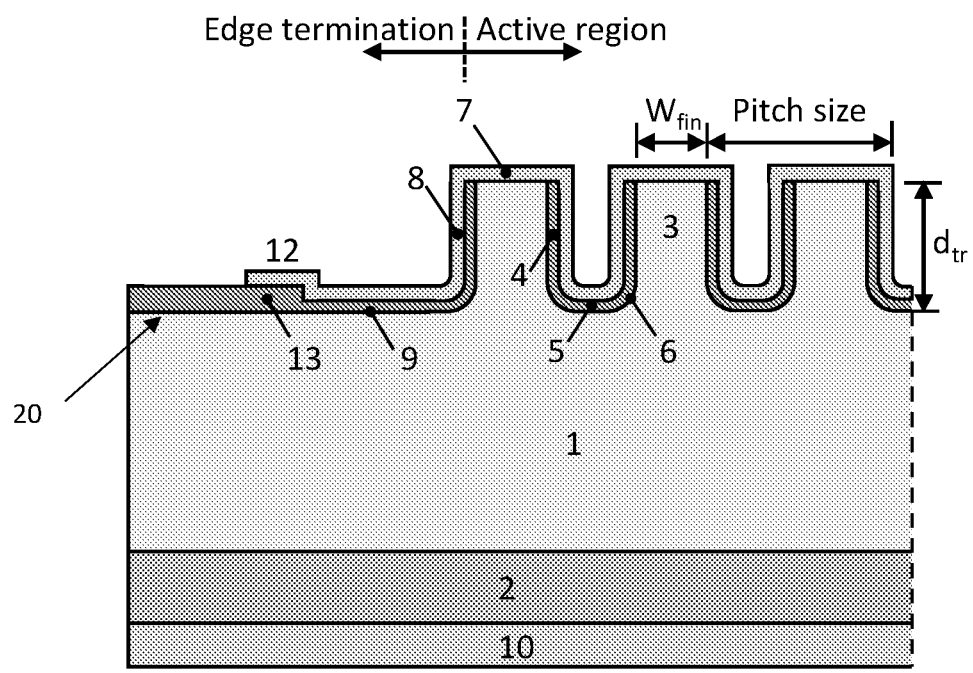
FIG. 2 shows Schematic cross-section of a first alternative high-voltage Group III trioxides, such as $\beta$-$Ga_2O_3$, trench-MOS barrier Schottky rectifier of these teachings.

FIG. 2 is an alternative implementation, in which a double field-plate edge termination is used. The double field-plate is realized by:

12. A stepped metal overhang at the edge of the device on top of the dielectric layer 13;

13. A dielectric layer thicker than the dielectric layer (4) covering the sidewall 28 and trench bottom (5).

The double field plate edge termination can further increase the breakdown voltage of the diode, if the breakdown is limited by the device edge. The thicker dielectric layer can be fabricated by another deposition step and a patterning step after the deposition and patterning of the first dielectric layer that covers the sidewall and trench bottom.

FIG. 3 is an alternative implementation, in which a double field-plate edge termination is designed and realized by the addition of an insulating ion-implanted region:

14. An insulation region created by implanting ions that acts as compensating deep acceptors. The possible choice of such ion can be of Argon, Nitrogen, Magnesium, Beryllium and Calcium ions.

Figure 3A:
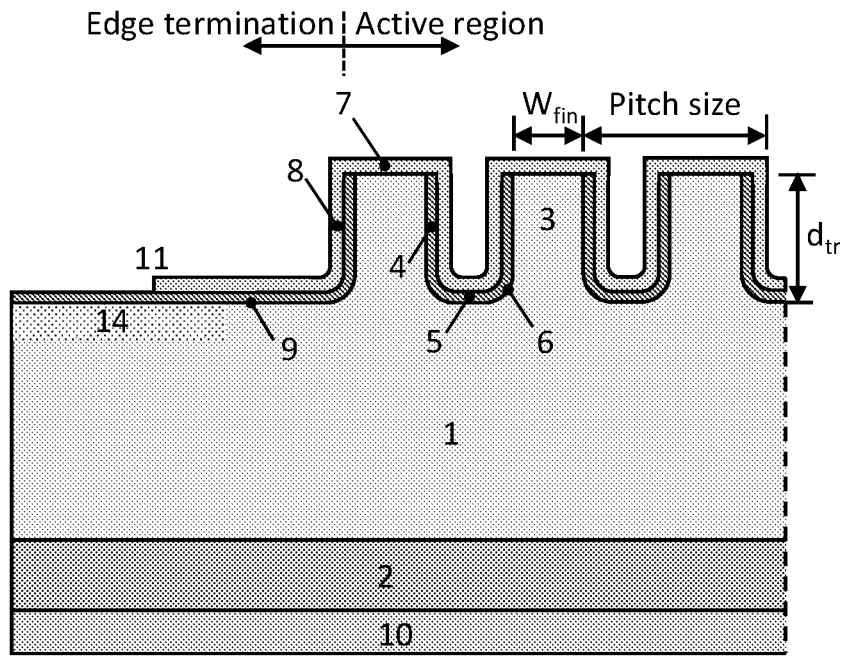
FIGS. 3A-3B Schematic cross-section of a second alternative high-voltage Group III trioxides, such as $\beta$-$Ga_2O_3$, trench-MOS barrier Schottky rectifier of these teachings.

As shown in FIG. 3A, in one instance, the insulating ion-implanted region 14 extends from the vertical edge surface 34 of the group III trioxide semiconductor device to a predetermined distance away from a nearest upstanding channel 3 and has a predetermined depth extending from the first distal surface 20 towards the first electrically conductive contact layer 10; the dielectric layer being deposited over the insulating ion-implanted region.

Figure 3B:
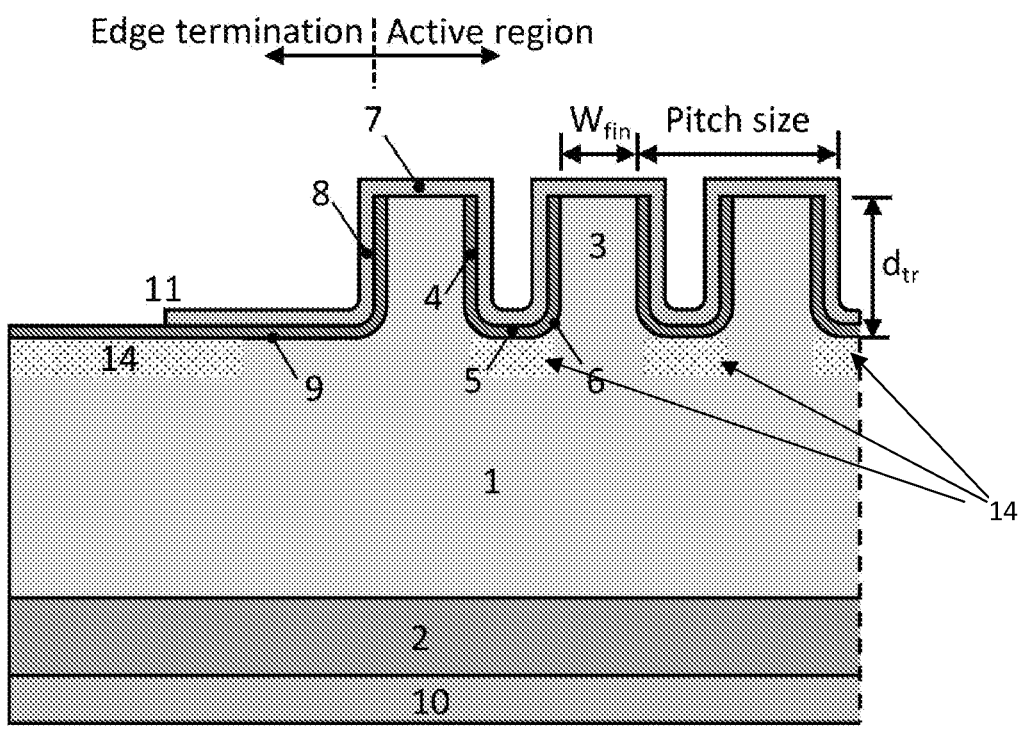

In another instance, shown in FIG. 3B, there are other insulating ion-implanted regions 14 in the n-type group III trioxide single crystal material 1; the other insulating ion-implanted regions extending under a bottom surface of each trench and having a predetermined depth extending from the bottom surface of each trench towards the first electrically conductive contact layer; the dielectric (insulating) layer being deposited over the insulating ion-implanted region.

Thus insulation implanted region can be made after the trench etching step, by selective implanting the ions with photoresist or other hard masks as masking materials. The crystal damage to the material may not need to be healed by a thermal anneal process. If the thermal anneal process is required, the metal layer on top of the fin needs to be removed prior to the thermal process. The Schottky contact metal can be redeposited after the thermal process and the opening of the dielectric layer on top of the fin channels.

Figure 4:
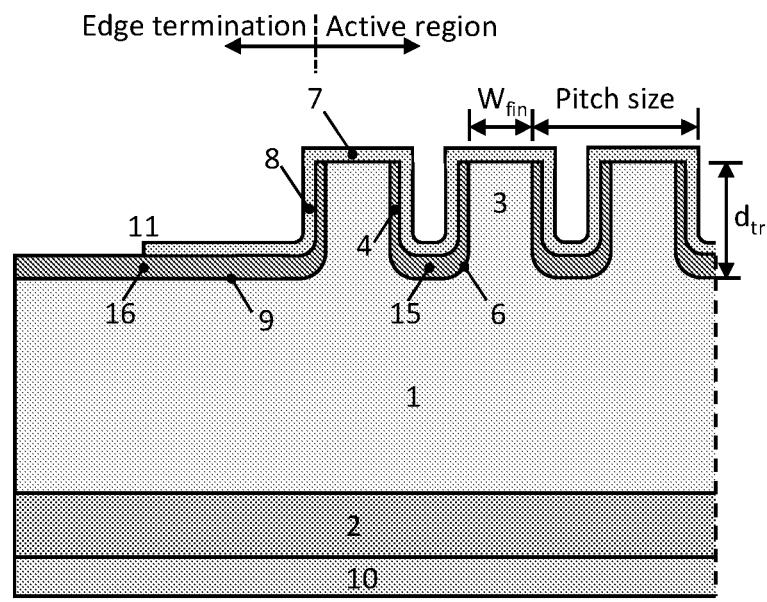
FIG. 4: Schematic cross-section of a third alternative high-voltage Group III trioxides, such as $\beta$-$Ga_2O_3$, trench-MOS barrier Schottky rectifier of these teachings.

FIG. 4 is an alternative implantation which has a thicker dielectric layer on the trench bottom than the dielectric layer covering the sidewall:

15. A dielectric (insulating) layer on the trench bottom thicker than the dielectric layer covering the fin sidewall (4).

16. A dielectric(insulating) layer on the surface flush with the trench bottom at the edge of the device. This dielectric (insulating) layer is of the same thickness as the dielectric layer on the trench bottom (15), that is, thicker than the dielectric layer covering the fin sidewall (4).

The thicker dielectric (insulating) layer (15, 16) can reduce the electric field in the β-Ga$_2$O$_3$ at the bottom of the trench, the trench bottom corner as well as the below the edge of the metal at the device periphery, thus could help increase the breakdown voltage. The realization of the thicker dielectric layer (15, 16) can be made with an anisotropic deposition, which deposit on the flat surface at a higher rate than on the sidewall. Alternatively, it can be realized by isotropic deposition, followed by selectively thinning the dielectric thickness on the sidewall. This requires a photoresist deposition after the isotropic deposition of the dielectric layer. After that, the photoresist is dry etching by oxygen plasma, leaving only some photoresist covering the bottom of the trench. Then, isotropic etching of the dielectric is performed, so that the dielectric layer on the sidewall is etched to be thinner, while the dielectric layer on the trench bottom is protected by the photoresist. After the etching, the photoresist is stripped.

In addition to the above alternative design of the structure, other variations are also within the scope of these teachings:

a. All crystal orientations of single crystal the Group III trioxide (such as, β-Ga$_2$O$_3$). such as (001), (100), (010), (−201) etc. can be chosen for the substrate and the epitaxial layer. The device processes remains the same.

b. The dielectric layer can be made of any high dielectric constant, high breakdown field materials, such as $Al_2O_3$, $HfO_2$, AlN, $ZrO_2$, $La_2O_3$. Similar device processes can be applied, and device operation is the same in principle.

c. The doping concentration of the fin channels can be adjusted from $1\times10^{15}$ cm$^{-3}$ to $5\times10^{17}$ cm$^{-3}$.

d. The doping concentration of the drift layer 1 can be adjusted from $1\times10^{15}$ cm$^{-3}$ to $5\times10^{17}$ cm$^{-3}$.

e. The Schottky contact metal/conductive material can be of any combination of Al, Ni, Mo, Cu, Au, etc.

f. The metal/conductive material contact on the sidewall can be replaced by Ti, Cr, Al, Mo or W.

g. Other edge termination techniques can be applied to the edge of the device, such as floating guard rings.

In one embodiment, the group III trioxide semiconductor device of these teachings can be fabricated by depositing an n-type group III trioxide single crystal material layer on a conductive substrate, a doping concentration of the n-type group III trioxide single crystal material layer being a varying doping concentration, depositing a Schottky conductive contact layer on the n-type group III trioxide single crystal material layer, etching to form at least two upstanding channels on the n-type group III trioxide single crystal material layer with the Schottky conductive contact layer, each upstanding channel having sidewalls extending between the Schottky conductive contact layer and a first distal surface of the n-type group III trioxide single crystal material layer, each upstanding channel being separated from another upstanding channel by a trench, depositing a dielectric layer over the first distal surface, over the at least two upstanding channels, over sidewalls of each upstanding channel, and over a bottom surface of each trench, etching the dielectric layer to expose the Schottky conductive contact layer on a top distal surface of each upstanding channel, depositing a second conductive layer over the dielectric layer on the sidewalls of each upstanding channel, depositing a third conductive layer over the dielectric layer on the bottom surface of each trench, and over a portion of the dielectric layer on the first distal surface, the third conductive layer, which is disposed over the portion of the dielectric layer on the first distal surface, being disposed a predetermined distance away from a vertical edge surface of the group III trioxide Schottky diode, and depositing a conductive ohmic contact layer on a surface of the conductive substrate opposite to the surface on which the n-type group III trioxide single crystal material layer was deposited.

In another embodiment, the group III trioxide semiconductor device of these teachings can be fabricated by depositing an n-type group III trioxide single crystal material layer on a substrate, a doping concentration of the n-type group III trioxide single crystal material layer being a varying doping concentration, depositing a Schottky conductive contact layer on the n-type group III trioxide single crystal material layer, etching to form at least two upstanding channels on the n-type group III trioxide single crystal material layer with the Schottky conductive contact layer, each upstanding channel having sidewalls extending between the Schottky conductive contact layer and a first distal surface of the n-type group III trioxide single crystal material layer, each upstanding channel being separated from another upstanding channel by a trench, depositing a dielectric layer over the first distal surface, over the at least two upstanding channels, over sidewalls of each upstanding channel, and over a bottom surface of each trench, etching the dielectric layer to expose the Schottky conductive contact layer on a top distal surface of each upstanding channel, depositing a second conductive layer over the dielectric layer on the sidewalls of each upstanding channel, depositing a third conductive layer over the dielectric layer on the bottom surface of each trench, and over a portion of the dielectric layer on the first distal surface, the third conductive layer, which is disposed over the portion of the dielectric layer on the first distal surface, being disposed a predetermined distance away from a vertical edge surface of the group III trioxide Schottky diode, removing the substrate (by means of etching or similar means.), and, depositing a conductive ohmic contact layer on a surface of the n-type group III trioxide single crystal material layer that is opposite the first distal surface and the Schottky conductive contact layer.

In yet another embodiment, the group III trioxide semiconductor device of these teachings can be fabricated by depositing an n-type group III trioxide single crystal material layer disposed on an n-doped group III trioxide single crystal second layer, a doping concentration of the n-doped group III trioxide single crystal second layer being greater than $1\times10^{18}$ cm$^{-3}$ and a doping concentration of the n-type group III trioxide single crystal material layer, being at most $5\times10^{17}$ cm$^{-3}$, depositing a Schottky conductive contact layer on the n-type group III trioxide single crystal material layer, etching to form at least two upstanding channels on the n-type group III trioxide single crystal material layer with the Schottky conductive contact layer, each upstanding channel having sidewalls extending between the Schottky conductive contact layer and a first distal surface of the n-type group III trioxide single crystal material layer, each upstanding channel being separated from another upstanding channel by a trench, depositing a dielectric layer over the first distal surface, over the at least two upstanding channels, over sidewalls of each upstanding channel, and over a bottom surface of each trench, etching the dielectric layer to expose the Schottky conductive contact layer on a top distal surface of each upstanding channel, depositing a second conductive layer over the dielectric layer on the sidewalls of each upstanding channel, depositing a third conductive layer over the dielectric layer on the bottom surface of each trench, and over a portion of the dielectric layer on the first distal surface; the third conductive layer, which is disposed over the portion of the dielectric layer on the first distal surface, being disposed up to a predetermined distance away from a vertical edge surface of the group III trioxide Schottky diode, and depositing a conductive ohmic contact layer on a surface of the n-doped group III trioxide single crystal second layer opposite to the surface on which the n-type group III trioxide single crystal material layer was deposited.

In any of the above described methods, the second conductive layer can include a metal with an electronic work function of less than 6 eV or compounds thereof or a metal with an electronic work function of less than 5 eV or compounds thereof.

Any of the three complete methods described above can also include depositing, after depositing the dielectric layer and before depositing the second conductive layer, another dielectric layer over a predetermined distance from the vertical edge surface, a resulting dielectric layer over the first distal surface, over the predetermined distance, being thicker than the dielectric layer over a rest of the first distal surface and over the sidewalls of each upstanding channel.

In another instance, any of the three complete methods described above can also include selectively implanting ions, after etching the at least two upstanding channels and before depositing the dielectric layer, over a region extending from the vertical edge surface to a predetermined distance away from a nearest upstanding channel, thereby forming an insulating ion-implanted region in the n-type group III trioxide single crystal material. In another embodiment, ions are selectively implanted, after etching the at least two upstanding channels and before depositing the dielectric layer, over other regions in the n-type group III trioxide single crystal material; the other regions extending under a bottom surface of each trench. The the ions can include at least one of Argon, Nitrogen, Magnesium, Beryllium and Calcium ions.

In any of the three complete methods described above, deposition of the dielectric layer can be anisotropic deposition, in which deposition over the bottom surface of each trench and over the first distal surface is at higher rate than deposition over the sidewalls of each upstanding channel.

In any of the three complete methods described above, depositing the dielectric layer can include depositing isotropically a first dielectric layer over the first distal surface, the sidewalls of each upstanding channel, and the bottom surface of each trench, depositing photoresist over the first distal surface, the sidewalls of each upstanding channel, and the bottom surface of each trench, etching the photoresist, leaving photoresist over designated areas, the designated areas including the bottom surface of each trench, isotropic etching of the first dielectric layer in order to remove a portion of the first dielectric layer, and, removing the photoresist.

In any of the above described methods, the n-type group III trioxide single crystal material layer can be $Ga_2O_3$. In embodiments including an n-doped group III trioxide single crystal second layer, the n-doped group III trioxide single crystal second layer can be $Ga_2O_3$.

In order to elucidate these teachings, an exemplary embodiment is presented below. It should be noted that these teachings are not limited to only the exemplary embodiment. In the exemplary embodiment, the Group III trioxide is $\beta$-$Ga_2O_3$.

The $\beta$-$Ga_2O_3$ trench-MOS barrier Schottky diodes of this disclosure are fabricated on commercially available conductive $\beta$-$Ga_2O_3$ single crystal substrate, on top of which an epitaxial drift layer of several micrometers thick and a net doping concentration around $1\times10^{16}$ cm$^{-3}$ is grown. The thickness of the drift layer and the net doping concentration are chosen depending on the desired reverse blocking voltage of the diode.

First, reactive ion etch (RIE) based on $BCl_3$ and Ar or Si ion implantation is performed on the backside of the wafer to facilitate ohmic contact. Next, Ni/Pt metal/conductive material stack is deposited and patterned by lithography and a lift-off process on the top surface, with the Ni layer serving as the Schottky contact and Pt layer as the hard mask for the subsequent etching for trench formation. Different contact metal/conductive material layer other than Ni could also be selected for different Schottky barrier height, which largely governs the forward voltage drop of the diode. Trenches are etched using reactive ion etch (RIE), resulting in vertical fin channels. The depth of the trenches is around 1-2 μm, the exact value of which depends on the doping level and doping profile of the drift layer, the width of the fin channels, Schottky barrier height and the target blocking voltage. Subsequently, the etched surface is cleaned in HCl before the deposition of an $Al_2O_3$ dielectric layer by atomic layer deposition (ALD). The thickness of the dielectric layer is around 100 nm. Next, the dielectric layer is opened on top of the fin channels by dry etching to expose the Ni/Pt Schottky contact. After that, Cr or Ti based metal/conductive material layer is sputtering on the sidewall. Ti and Cr are low work-function metals with a good adhesion property. The use of low work-function metals on the sidewall minimize the depletion of the fin channel due to the work-function difference between the metal and $\beta$-$Ga_2O_3$. At the same time, the sputtered metal layer is patterned by lithography and a lift-off process, which effectively isolates the individual devices. Lastly, Ti/Au metal stack is evaporated on the backside of the wafer as the cathode ohmic contact, with Ti as the contact layer. The fabricated devices are tested, diced and packaged for usage as discrete power rectifiers.

An example of making the TMBS diodes for high voltage blocking capability and simultaneously low on-resistance is described as follows:

1. Thickness and doping of the n-type epitaxial layer: 10 μm, $1$-$2\times10^{16}$ cm$^{-3}$ net doping concentration.
2. Trench depth/Fin channel height ($d_{tr}$ in FIG. 1): 1.5 μm
3. Fin channel width ($W_{fin}$ in FIG. 1): 2 μm.
4. Pitch size (shown in FIG. 1): 4 μm.
5. Schottky contact metal layer: Ni 20 nm
6. Metal hard mask: Pt 120 nm
7. $Al_2O_3$ dielectric thickness: 100 nm.
8. Sidewall metal stack: Ti or Cr 40 nm/Pt 40 nm
9. Backside ohmic contact metal stack: Ti 50 nm/Au 100 nm.

In the exemplary embodiment of this disclosure, a composite metal stack consisting of Ni, Cr and Pt is used with Ni as the Schottky metal/conductive material contact layer.

Figure 5A:
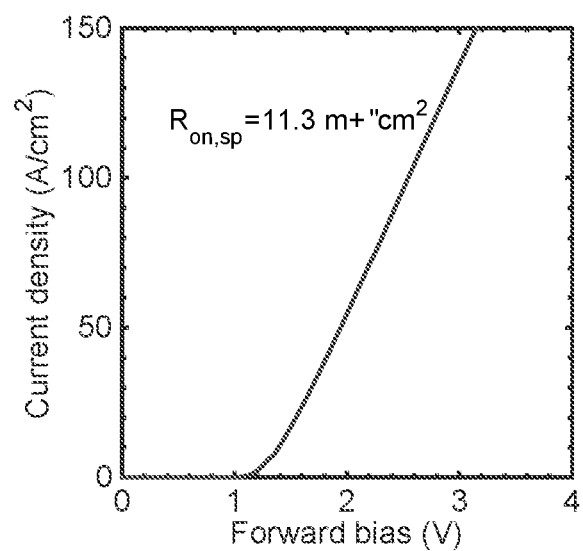
FIGS. 5A and 5B show (a) Representative forward I-V characteristics of the $\beta$-$Ga_2O_3$ trench-MOS barrier Schottky diodes; the differential specific on-resistance is extracted to be 11.3 m$\Omega$·cm$^2$; the turn on voltage is around 1.2-1.3 V; (b) Comparison of the forward I-V characteristics between 3 generations.
Figure 5B:
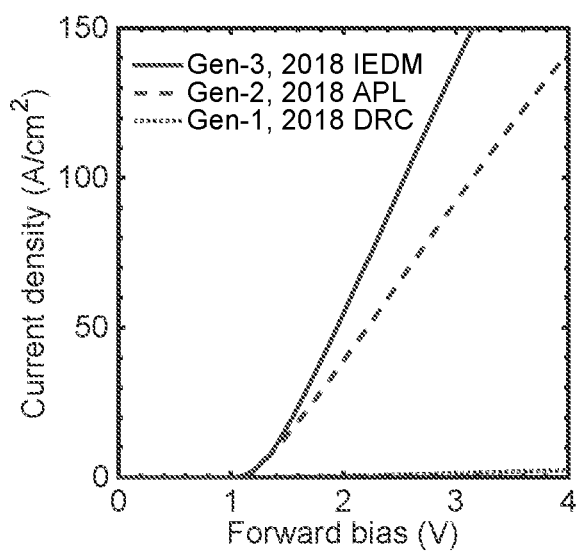

FIG. 5 shows the representative I-V characteristics the fabricated β-Ga2O3 trench-MOS barrier Schottky diodes. The differential specific on-resistance is extracted to be 11.3 mΩ·cm$^2$. The turn on voltage of the diodes is around 1.2-1.3 V.

Figure 6A:
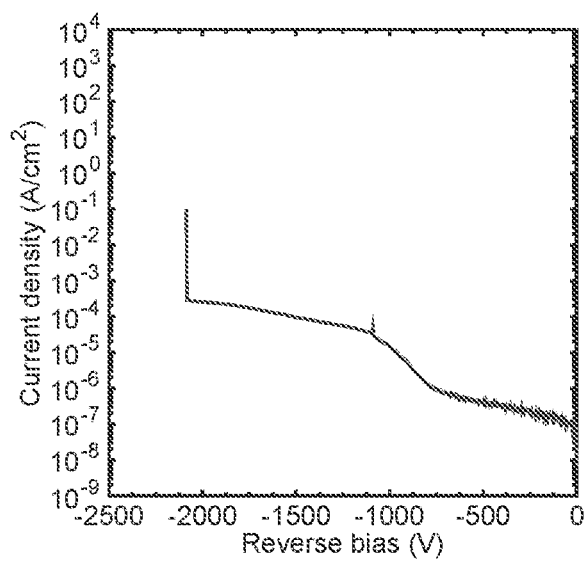
FIGS. 6A, 6B show (a) Representative reverse I-V characteristics of the $\beta$-$Ga_2O_3$ trench-MOS barrier Schottky diodes; the device have a breakdown voltage higher than 2000 V; the reverse leakage current density is lower than 1 mA/cm$^2$; the fin-width is 2 μm; (b) Comparison of the reverse I-V characteristics between 3 generations.
Figure 6B:
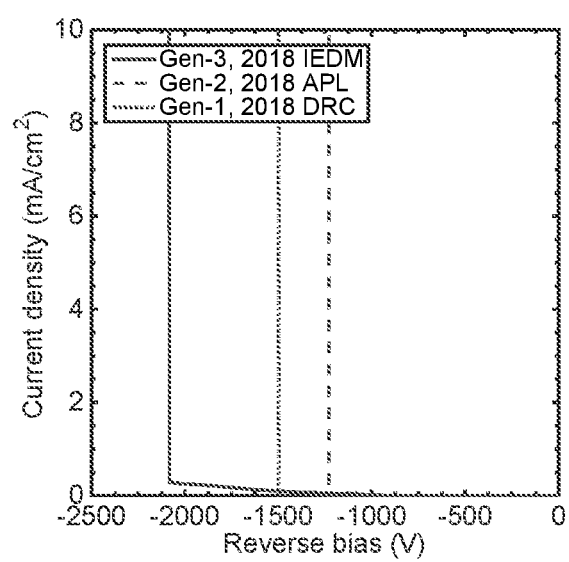

The representative reverse I-V characteristics is shown in FIG. 6. The device has a breakdown voltage higher than 2000 V. The reverse leakage current density is lower than 1 mA/cm$^2$.

Other differences between the exemplary embodiment and the trench Schottky barrier diode work of Sasaki and coworkers are presented below.

In comparison with the trench Schottky barrier diode work of Sasaki and coworkers, the epitaxial layer used in the exemplary embodiment of these teachings have a lower net doping concentration. This allows for a much higher breakdown voltage (>1 kV).

The dielectric layer used in the exemplary embodiment of these teachings is $Al_2O_3$, while the dielectric layer used in the work of Sasaki and coworkers is $HfO_2$.

In the work of Sasaki and coworkers, a different composite metal stack is used for the Schottky contact (Cu as the contact layer in earlier work and Mo as the contact layer in the later work).

In the exemplary embodiment of these teachings, for the sidewall contact, a composite metal stack consisting of Cr and Pt is used with Cr as the contacting layer. In contrast, the same metal stack used for the Schottky contact is used for the sidewall contact in the work of Sasaki and coworkers, resulting in a higher work function of the contacting metal layer on the sidewall.

In the work of Sasaki and coworkers, the device edge termination is made on the flat surface flush with the top of the conducting fin channel. Their design creates a weak point at the trench bottom corner closest to the device periphery/edge, which has a much higher field crowding in comparison with the trench corners in the inside of the device.

Apart from the aforementioned differences in the materials of choice and device topology, the fabrication process of the proposed device is also different from that disclosed in work of Sasaki and coworkers. Specifically, the opening of the dielectric on top of the fin channels is patterned by CMP process in work of Sasaki and coworkers, while it is patterned by photolithography and etching in the device of this disclosure. The lack of CMP process in the fabrication method of this disclosure allows for the possibility of minimal surface damage to the surface of $\beta$-$Ga_2O_3$, especially if wet etching of the dielectric is used, thus allowing for a Schottky contact with higher quality. In addition, the prototype devices in work of Sasaki and coworkers have a breakdown voltage lower than 300 V, while the exemplary embodiment of these teachings devices have a breakdown voltage higher than 1000 V.

The present teachings can be used as power rectifier in power electronic circuits and systems as discrete devices. Such systems include electric vehicles, power supplies, photovoltaic systems, power grids etc. In comparison with high voltage rectifiers realized by other materials (SiC or Si), the high voltage $\beta$-$Ga_2O_3$ trench-MOS barrier Schottky rectifiers promises lower conduction and switching loss, thus can improve the power efficiency of a power electronic system.

The disclosure can also be monolithically integrated with vertical $\beta$-$Ga_2O_3$ power transistors as the free-wheeling diodes. The integrated power switches can also be used in power electronic circuits and systems as discrete devices, providing high efficiency, high speed power regulation functions.

Although these teachings has been described with respect to various embodiments, it should be realized these teachings are also capable of a wide variety of further and other embodiments within the spirit and scope of the appended claims.

What is claimed is:

1. A Group III trioxide semiconductor device comprising:
a first electrically conductive contact layer;
an n-type group III trioxide single crystal material layer disposed electrically operatively in contact with the first electrically conductive contact layer, the n-type group III trioxide single crystal material layer having a first distal surface disposed away from the first electrically conductive contact layer, at least two upstanding channels, each upstanding channel having a distal top surface and sidewalls extending between the distal top surface and the first distal surface of the n-type group III trioxide single crystal material layer; a height of at least one upstanding channel being equal to a distance between the distal top surface and the first distal surface; said each upstanding channel being entirely separated from another upstanding channel by a trench; the first distal surface being disposed between the first electrically conductive contact layer and the distal top surface; said first distal surface being located below the distal top surface and above the first electrically conductive contact layer, bottom corners of each trench being curved; a doping concentration of the n-type group III trioxide single crystal material layer being one of a varying doping concentration, the varying doping concentration having a largest value and a smallest value according to a predetermined configuration, and a predetermined doping concentration;
a dielectric layer deposited over the first distal surface, over sidewalls of each upstanding channel, and over a bottom surface of each trench of the n-type group III trioxide single crystal material layer;
a second electrically conductive layer deposited over the dielectric layer on the sidewalls of each upstanding channel;
a third electrically conductive layer deposited over the dielectric layer on the bottom surface of each trench, and over a portion of the dielectric layer on the first distal surface; the third electrically conductive layer, being disposed, over the portion of the dielectric layer on the first distal surface, a predetermined distance away from a vertical edge surface of the group III trioxide semiconductor device; the third electrically conductive layer being disposed a predetermined distance away from a vertical edge surface of the group III trioxide semiconductor device forms a field-plate for edge termination; the vertical edge surface extending from the first electrically conductive contact layer to the first distal surface; the first distal surface being in contact with the vertical edge surface; the third electrically conductive layer being in electrical contact with the second electrically conductive layer; and
a fourth electrically conductive layer deposited over the distal top surface of each upstanding channel; the fourth electrically conductive layer being in electrical contact with the second electrically conductive layer; wherein there are no p-type regions in the Group III trioxide semiconductor device; wherein the Group III trioxide semiconductor device has breakdown voltage of more than 1200 volts and an on resistance of less than 20 m$\Omega$·cm$^2$; from the breakdown voltage of more than 1200 volts and an on resistance of less than 20 m$\Omega$·cm$^2$ of the Group III trioxide semiconductor device, a value of a Baliga Figure of Merit is obtained for the Group III trioxide semiconductor device; wherein the group III trioxide semiconductor device is a barrier Schottky diode.

2. The group III trioxide semiconductor device of claim 1 wherein a conductive substrate is disposed between the first electrically conductive contact layer and the n-type group III trioxide single crystal material layer.

3. The group III trioxide semiconductor device of claim 1 wherein the doping concentration of the n-type group III trioxide single crystal material layer is the varying doping concentration.

4. The group III trioxide semiconductor device of claim 3 wherein a largest doping concentration is greater than $1 \times 10^{18}$ cm$^{-3}$ and a smallest concentration is not less than $1 \times 10^{15}$ cm$^{-3}$.

5. The group III trioxide semiconductor device of claim 1 further comprising:
an n-doped group III trioxide single crystal second layer disposed between the first electrically conductive contact layer and the n-type group III trioxide single crystal material layer; a doping concentration of the n-doped group III trioxide single crystal second layer being greater than $1 \times 10^{18}$ cm$^{-3}$.

6. The group III trioxide semiconductor device of claim 5 wherein the doping concentration of the n-type group III trioxide single crystal material layer is between $1 \times 10^{15}$ and $5 \times 10^{17}$ cm$^{-3}$.

7. The group III trioxide semiconductor device of claim 5 wherein the n-doped group III trioxide single crystal second layer and the n-type group III trioxide single crystal material layer comprise $Ga_2O_3$.

8. The group III trioxide semiconductor device of claim 1 wherein a distance from the distal top surface of each upstanding channel to the first distal surface is between 0.2 µm and 4 µm.

9. The group III trioxide semiconductor device of claim 1 wherein a width of each upstanding channel is between 0.2 µm and 4 µm.

10. The group III trioxide semiconductor device of claim 1 wherein a width of each trench is between 0.2 µm and 4 µm.

11. The group III trioxide semiconductor device of claim 1 wherein the second electrically conductive layer comprises a metal with an electronic work function of less than 6 eV or compounds thereof.

12. The group III trioxide semiconductor device of claim 1 wherein the second electrically conductive layer comprises a metal with an electronic work function of less than 5 eV or compounds thereof.

13. The group III trioxide semiconductor device of claim 12 wherein the metal with an electronic work function of less than 5 eV is one of Ti, Cr, Al, Mo, or W.

14. The group III trioxide semiconductor device of claim 1 wherein the n-type group III trioxide single crystal material layer comprises $Ga_2O_3$.

15. The group III trioxide semiconductor device of claim 1 wherein, over another predetermined distance from the vertical edge surface of the group III trioxide semiconductor device, said another predetermined distance being longer that the predetermined distance from the vertical edge surface and shorter than a distance from the vertical edge surface to a closest upstanding channel, the dielectric layer over the distal surface is thicker than the dielectric layer over a rest of the distal surface, or over the dielectric layer over the sidewalls of each upstanding channel; and
wherein the third electrically conductive layer is disposed over a portion of the dielectric layer that is thicker than the dielectric layer over the rest of the first distal surface; the third electrically conductive layer is disposed over a portion of the dielectric layer; the portion of the dielectric layer that is thicker than the dielectric layer over the rest of the first distal surface causes a stepped overhang to be formed in the third electrically conductive layer; the stepped overhang providing a double field-plate edge termination; the third electrically conductive layer being disposed the predetermined distance away from the vertical edge surface of the group III trioxide semiconductor device.

16. The group III trioxide semiconductor device of claim 1 further comprising an insulating ion-implanted region in the n-type group III trioxide single crystal material; the insulating ion-implanted region extending from the vertical edge surface of the group III trioxide semiconductor device to a predetermined distance away from a nearest upstanding channel and having a predetermined depth extending from the first distal surface towards the first electrically conductive contact layer; the dielectric layer being deposited over the insulating ion-implanted region.

17. The group III trioxide semiconductor device of claim 16 also comprising other insulating ion-implanted regions in the n-type group III trioxide single crystal material; the other insulating ion-implanted regions extending under a bottom surface of each trench and having a predetermined depth extending from the bottom surface of each trench towards the first electrically conductive contact layer; the dielectric layer being deposited over the insulating ion-implanted region.

18. The group III trioxide semiconductor device of claim 16 wherein the insulating ion-implanted region comprises at least one of Argon, Nitrogen, Magnesium, Beryllium and Calcium ions.

19. The group III trioxide semiconductor device of claim 16 wherein the n-type group III trioxide single crystal material layer comprises $Ga_2O_3$.

20. The group III trioxide semiconductor device of claim 1 wherein the dielectric layer over the bottom surface of each trench is thicker than the dielectric layer over the sidewalls of each upstanding channel.

21. The group III trioxide semiconductor device of claim 20 wherein the dielectric layer over the first distal surface is also thicker than the dielectric layer over the sidewalls of each upstanding channel.

22. The group III trioxide semiconductor device of claim 20 wherein the n-type group III trioxide single crystal material layer comprises $Ga_2O_3$.

* * * * *